US010164172B2

(12) United States Patent
Hong et al.

(10) Patent No.: US 10,164,172 B2
(45) Date of Patent: Dec. 25, 2018

(54) MULTI-LAYERED MAGNETIC THIN FILM STACK AND DATA STORAGE DEVICE HAVING THE SAME

(71) Applicants: SK hynix Inc., Icheon (KR); INDUSTRY-ACADEMIC COOPERATION FOUNDATION, YONSEI UNIVERSITY, Seoul (KR)

(72) Inventors: Jongill Hong, Seoul (KR); Taejin Bae, Seoul (KR); Sung Joon Yoon, Guri (KR)

(73) Assignees: SK HYNIX INC., Icheon (KR); INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 15/486,180

(22) Filed: Apr. 12, 2017

(65) Prior Publication Data

US 2017/0294574 A1  Oct. 12, 2017

(30) Foreign Application Priority Data

Apr. 12, 2016 (KR) .................. 10-2016-0045186

(51) Int. Cl.
*H01L 43/08* (2006.01)
*H01L 43/02* (2006.01)
*H01L 43/10* (2006.01)
*G11C 11/16* (2006.01)

(52) U.S. Cl.
CPC ............ *H01L 43/08* (2013.01); *G11C 11/161* (2013.01); *H01L 43/02* (2013.01); *H01L 43/10* (2013.01)

(58) Field of Classification Search
CPC ......... H01L 43/08; H01L 43/02; H01L 43/10; G11C 11/161
See application file for complete search history.

(56) References Cited

U.S. PATENT DOCUMENTS

| | | | |
|---|---|---|---|
| 2006/0083057 A1* | 4/2006 | Nakayama | H01L 43/08 365/171 |
| 2009/0097168 A1 | 4/2009 | Inomata et al. | |
| 2009/0180215 A1 | 7/2009 | Ishikawa et al. | |
| 2010/0244897 A1* | 9/2010 | Saito | G11C 11/16 326/49 |
| 2015/0162378 A1* | 6/2015 | Carey | H01L 43/02 257/421 |
| 2015/0188034 A1* | 7/2015 | Takahashi | H01L 43/02 257/421 |

OTHER PUBLICATIONS

Hirohata et al. ("Roadmap for Emerging Materials for Spintronic Device Applications," IEEE Transaction on Magnetics, vol. 51, issue 10, 2015).*
Bae et al. ("Co2MnSi Heusler alloy as an enhancing layer of perpendicular magnetic anisotropy for MgO-based magnetic tunnel junctions with L10 ordered FePd," Japanese Journal of Applied Physics 55, pp. 013001-1 to 01300-5, Dec. 10, 2015).*

* cited by examiner

*Primary Examiner* — Yasser A Abdelaziez

(57) ABSTRACT

Provided are a multi-layered magnetic thin film stack, a magnetic tunneling junction, and a data storage device. The multi-layered magnetic thin film stack includes a FePd alloy layer including an alloy of iron (Fe) and palladium (Pd); a tunneling barrier layer, which includes MgO and is disposed on the FePd alloy layer; and a Heusler alloy layer disposed between the FePd alloy layer and the tunneling barrier layer, wherein the FePd alloy layer and the Heusler alloy layer constitute a hybrid magnetic layer.

18 Claims, 11 Drawing Sheets

MULTI-LAYERED MAGNETIC THIN FILM STACK AND DATA STORAGE DEVICE HAVING THE SAME

CROSS-REFERENCES TO RELATED APPLICATION

The present application claims priority under 35 U.S.C. 119(a) to Korean application number 10-2016-0045186, filed on Apr. 12, 2016, which is herein incorporated by reference in its entirety.

BACKGROUND OF THE PRESENT INVENTION

1. Field of the Present Invention

The present disclosure relates to a magnetic structure, and more particularly, to a multi-layered magnetic thin film stack and a data storage device having the same.

2. Description of the Related Art

A magnetic random access memory (magnetic RAM or MRAM) is a non-volatile magnetic memory device that utilizes giant magnetic resistance effect or tunneling magnetic resistance effect based on spin-dependent conductivity peculiar to a nano-magnetic material. Compared to a phase change RAM (PcRAM) or a resistive RAM (ReRAM), MRAM is recently being spotlighted due to faster speed and excellent durability against repeated accesses.

A spin transfer torque MRAM (STT-MRAM), which is the most actively researched type of MRAM device, exhibits high speed operation, excellent power efficiency, and high-density integration, thus being a leading candidate for next-generation memory devices. STT-RAM includes a magnetic tunnel junction (MTJ) structure in which one tunneling barrier layer is interposed between two magnetic thin films. In the MTJ structure, compared to in-plane magnetic anisotropy, perpendicular magnetic anisotropy (also referred to as PMA) features low switching-current density for magnetization inversion and high thermal stability, and is advantageous for scaling memory devices.

The PMA may be obtained from intrinsic magneto-crystalline anisotropy of one or more magnetic layers. Therefore, in order to implement a MRAM device, research on materials exhibiting reliable intrinsic magneto-crystalline anisotropy is required. Generally, in order to form a magnetic thin film having a crystal structure exhibiting the intrinsic magneto-crystalline anisotropy, a high fabricating temperature equal to or above 500° C. is used, and thus thermal burden for fabricating a memory device is a severe challenge. Furthermore, in order to apply magnetic thin film having intrinsic magneto-crystalline anisotropy to a MRAM memory, the magnetic thin film is should exhibit a high degree of tunneling magneto resistance (TMR) effect. To this end, the magnetic thin film having the intrinsic magneto-crystalline anisotropy should have high spin polarizability.

SUMMARY OF THE PRESENT INVENTION

The present disclosure provides a multi-layered magnetic thin film stack including a magnetic layer that may be fabricated at a low temperature and may simultaneously enhance perpendicular magnetic anisotropy (PMA) and spin polarizability.

The present disclosure also provides a data storage device employing a multi-layered magnetic thin film stack having the above-stated advantages.

According to an aspect of the present disclosure, there is provided a multi-layered magnetic thin film stack including a FePd alloy layer comprising an alloy of iron (Fe) and palladium (Pd); a tunneling barrier layer disposed on the FePd alloy layer, the tunneling barrier layer comprising MgO; and a Heusler alloy layer disposed between the FePd alloy layer and the tunneling barrier layer. According to an embodiment, an angle difference between a preferential oriented crystallographic axis of the FePd alloy layer and a preferential-oriented crystallographic axis of the Heusler alloy layer may be 45°.

The Heusler alloy layer may include a cobalt (Co) based alloy having a chemical formula $Co_2YZ$ (Y denotes a transition metal, and Z denotes a typical). According to an embodiment, the transition metal Y may include at least one of manganese (Mn), iron (Fe), and chromium (Cr), and the typical element Z may include at least one of silicon (Si), aluminium (Al), and germanium (Ge).

The Heusler alloy layer may include $Co_2MnSi$. Lattice mismatch between the Heusler alloy layer and the FePd alloy layer may be less than or equal to 4%. The FePd alloy layer may have an $L1_0$ crystal structure. According to some embodiments, the Heusler alloy layer may have a B2 crystal structure or an $L2_1$ crystal structure.

Thickness of the FePd alloy layer may be within a range from about 3 nm to about 10 nm. Furthermore, thickness of the Heusler alloy layer may be within a range from about 0.5 nm to about 1.5 nm.

A substrate may be provided on a surface of the FePd alloy layer opposite to a surface of the FePd alloy layer contacting the Heusler alloy layer. The substrate may include a monocrystalline or polycrystalline material having a Miller index (001) texture or a (001) preferentially-oriented surface. According to an embodiment, the substrate may include a MgO (001) basal thin film.

According to another aspect of the present disclosure, there is provided a magnetic tunneling junction (MTJ) including a tunneling barrier layer, a magnetic pinned layer disposed on a first surface of the tunneling barrier layer, and a magnetic free layer disposed on a second surface of the tunneling barrier layer opposite to the first surface of the tunneling barrier layer. In this case, at least one of the magnetic pinned layer and the magnetic free layer may include a hybrid magnetic layer that includes a FePd alloy layer, which includes iron (Fe) and palladium (Pd) and has an $L1_0$ crystal structure having an easy perpendicular magnetization axis; and a Heusler alloy layer disposed between the FePd alloy layer and the tunneling barrier layer.

The tunneling barrier layer may include $Al_2O_3$, MgO, $TiO_2$, AlN, RuO, SrO, SiN, $CaO_x$, $HfO_2$, $Ta_2O_5$, $ZrO_2$, SiC, $SiO_2$, $SiO_xN_y$, or a stack of two or more thin films thereof. The magnetic pinned layer or the magnetic free layer may include an anti-ferroelectric layer to be magnetically coupled with the hybrid magnetic layer.

An angle difference between a preferential oriented crystallographic axis of the FePd alloy layer and a preferential-oriented crystallographic axis of the Heusler alloy layer is 45°. The Heusler alloy layer may include a cobalt (Co) based alloy having a chemical formula $Co_2YZ$ (Y denotes a transition metal, and Z denotes a typical element). The transition metal Y may include at least one of manganese (Mn), iron (Fe), and chromium (Cr), and the typical element Z may include at least one of silicon (Si), aluminium (Al), and germanium (Ge).

The Heusler alloy layer may include $Co_2MnSi$. Furthermore, lattice mismatch between the Heusler alloy layer and the FePd alloy layer may be less than or equal to 4%.

According to an embodiment, the Heusler alloy layer may have a B2 crystal structure or an $L2_1$ crystal structure. According to an embodiment, thickness of the FePd alloy layer may be within a range from about 3 nm to about 10 nm. Thickness of the Heusler alloy layer may be within a range from about 0.5 nm to about 1.5 nm.

According to an embodiment, a substrate may be provided on a surface of the FePd alloy layer opposite to a surface of the FePd alloy layer contacting the Heusler alloy layer. The substrate may include a monocrystalline or polycrystalline material having a Miller index (001) texture or a (001) preferably-oriented surface. The substrate may include a MgO (001) basal thin film.

According to another aspect of the present disclosure, there is provided a data storage device including a memory cell that may include the above-stated MTJ as a data storage element.

BRIEF DESCRIPTION OF THE DRAWINGS

The above and other features and advantages of the present disclosure will become more apparent from the following embodiments and the attached drawings in which.

DETAILED DESCRIPTION OF THE PRESENT INVENTION

Figure 1A:
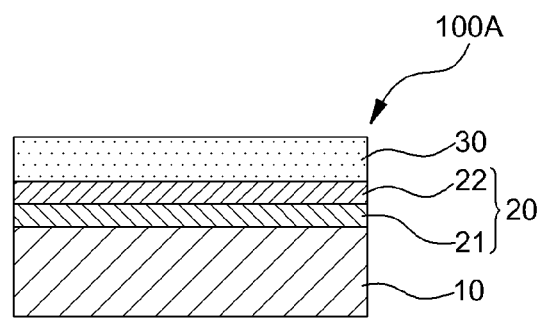
FIGS. 1A and 1B are sectional views of multi-layered magnetic thin film stacks according to various embodiments of the present disclosure.

The present disclosure will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

In the drawings, the thicknesses of layers and regions are exaggerated for clarity. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that although the terms first and second are used herein to describe various elements, these elements should not be limited by these terms. These terms are only used to distinguish one element from another element. Thus, a first element discussed below could be termed a second element, and similarly, a second element may be termed a first element without departing from the teachings of the present disclosure.

It will be understood that when a layer is referred to as being "formed on," another layer, it can be directly formed on the other layer or intervening layers may be present therebetween. Likewise, when a material is referred to as being adjacent to another material, intervening materials may be present therebetween. In contrast, when a layer or material is referred to as being "directly" formed on another layer or material or as being "directly" adjacent to or contacting another layer or material, there are no intervening materials or layers therebetween.

The present disclosure will now be described more fully with reference to the accompanying drawings, in which exemplary embodiments of the invention are shown. In the drawings, for example, sizes and shapes of members may be exaggerated for clarity and convenience of explanation. Accordingly, the shapes may be modified in actual practice.

Accordingly, the scope of this disclosure should not be construed as being limited to specific shapes of regions.

The term "substrate" used herein includes a supporting structure such as silicon, silicon-on-insulator (SOI), or silicon-on-semiconductor (SOS), a semiconductor layer formed on a supporting structure other than a semiconductor, a doped or undoped semiconductor layer, and a modified semiconductor layer. Also, the term "semiconductor" is not limited to a silicon-based material and collectively refers to carbon, a polymer, silicon-germanium, germanium, a group III-V semiconductor material such as a gallium-arsenic-based compound, a group II-VI semiconductor material, or a mixed semiconductor material. The term "non-semiconductor" may refer to an insulating ceramic material, a metal, or a polymer material, but is not limited thereto.

Figure 1B:
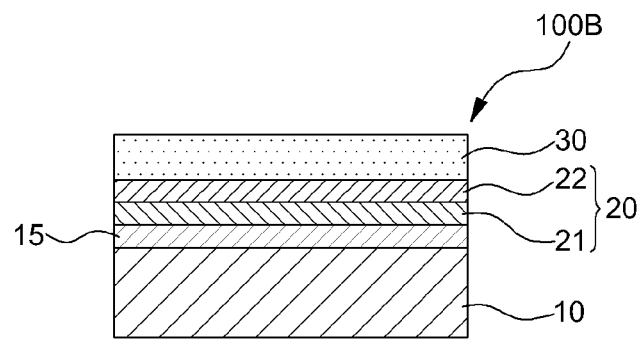

FIGS. 1A and 1B are sectional views of multi-layered magnetic thin film stacks 100A and 100B according to various embodiments of the present disclosure.

Referring to FIG. 1A, the multi-layered magnetic thin film stack 100A includes a hybrid magnetic layer 20 including a FePd alloy layer 21 that includes an alloy of iron (Fe) and palladium (Pd) and is disposed on a substrate 10, and a Heusler alloy layer 22 that is disposed on the FePd alloy layer 21. Although not shown, a conductive pattern, such as an electrode or a wire, may be disposed on the substrate 10, and the FePd alloy layer 21 and the Heusler alloy layer 22 may be sequentially disposed on the conductive pattern.

The FePd alloy layer 21 may obtain an $L1_0$ crystal structure via a heat treatment as described below. In this case, the FePd alloy layer 21 may have vertical magnetic anisotropy in a direction [001] perpendicular to the FePd alloy layer 21. The FePd alloy layer 21 having the $L1_0$ crystal structure is an isomer of FePd alloy having face centered cubic (FCC) structure. The FePd alloy having the FCC structure may be more easily formed than a FePd alloy having the $L1_0$ crystal structure, but the FePd alloy with the FCC structure is a magnetic material having in-plane magnetic anisotropy.

Although the FePd alloy layer 21 having the $L1_0$ crystal structure is a vertical magnetic anisotropic material having great magnetic anisotropic energy and an easy perpendicular magnetization axis, applying only the FePd alloy layer 21 to a memory device may not be adequate due to a low spin polarizability (about 42%) of the FePd alloy. On the contrary, although the Heusler alloy layer 22 is a semi-metal having a theoretical spin polarizability of 100%, the semi-metal has in-plane magnetic anisotropy and relatively low magnetic anisotropic energy. However, according to an embodiment of the present disclosure, in the hybrid magnetic layer 20, high spin polarizability of the Heusler alloy layer 22 enables the Heusler alloy layer 22 to be a reinforcement layer that enhances the low spin polarizability of the FePd alloy layer 21, and the relatively high magnetic anisotropic energy of the FePd alloy layer 21 enables the magnetic anisotropy energy of the hybrid magnetic layer 20 to be maintained or raised. As a result, a magnetic thin film stack 100A with commonly enhanced magnetic anisotropic energy and spin polarizability may be provided. Furthermore, the Heusler alloy layer 22 induces the underlying FePd alloy layer 21, which is prone to be crystallized to have an FCC structure, to be crystallized to have the $L1_0$ crystal structure having vertical magnetic anisotropy, thereby crystallographically affecting the underlying FePd alloy layer 21. Detailed description thereof will be given below.

In order that the Heusler alloy layer 22 may crystallographically affect the FePd alloy layer 21 to transform its phase to have the $L1_0$ crystal structure, a lattice constant of the Heusler alloy layer 22 may be adjusted. In an embodiment of the present disclosure, the lattice constant of the Heusler alloy layer 22 may be adjusted by controlling a solid-solution ratio of the Heusler alloy layer 22. For example, the Heusler alloy layer 22 may include a cobalt (Co) based alloy having a chemical formula $Co_2YZ$, where Y denotes a transition metal, and Z denotes a typical element, e.g. a non-transition element. The transition metal Y may be at least one of manganese (Mn), iron (Fe), and chromium (Cr), for example. However, embodiments of the present disclosure are not limited thereto. The typical element Z may be at least one of silicon (Si), aluminium (Al), and germanium (Ge), for example. However, embodiments of the present disclosure are not limited thereto. The Heusler alloy layer 22 may exhibit high perpendicular polarizability when the Heusler alloy layer 22 has a B2 crystal phase or a $L2_1$ crystal phase. For example, the Heusler alloy layer 22 may include $Co_2MnSi$.

According to an embodiment, the thickness of the FePd alloy layer 21 may be from about 3 nm to about 10 nm.

When the thickness of the FePd alloy layer 21 is less than 3 nm, it is difficult to form a continuous magnetic thin film layer. On the contrary, when thickness of the FePd alloy layer 21 exceeds 10 nm, it is difficult to induce strong vertical magnetic anisotropy even when the FePd alloy layer 21 having the $L1_0$ phase is formed. In an embodiment, thickness of the Heusler alloy layer 22 may depend on thickness of the FePd alloy layer 21 which interfaces with the Heusler alloy layer 22, and may be determined according to Equation 1 below.

[Equation 1]

$$E = K_u^{FePd} \times V_{FePd} - 2\pi M_{FePd}^2 \times V_{FePd} - 2\pi M_{Heusler}^2 \times V_{Heusler}$$

Here, E denotes magnetic anisotropic energy, $K_u^{FePd}$ denotes magnetic anisotropic constant of the FePd alloy layer, and $V_{FePd}$ and $V_{Heusler}$ respectively denote volumes of the FePd alloy layer and a Heusler alloy layer. $M_{FePD}$ and $M_{Heusler}$ denote saturation magnetization values of the FePd alloy layer and the Heusler alloy layer, respectively. Based on Equation 1, thickness of the Heusler alloy layer 22 may be selected within a range corresponding to positive magnetic anisotropic energy.

According to an embodiment, when the thickness of the FePd alloy layer 21 is 3 nm, the thickness of the Heusler alloy layer 22 for having vertical magnetic anisotropy is from about 0.5 nm to about 1.5 nm. When the thickness of the Heusler alloy layer 22 is less than 0.5 nm, it is difficult for the Heusler alloy layer 22 to form a stable interface with the FePd alloy layer 21, and thus it is difficult to induce the FePd alloy layer 21 to be phase-changed into the $L1_0$ crystal structure. On the other hand, when the thickness of the Heusler alloy layer 22 exceeds 1.5 nm, a vertical magnetic anisotropy of the entire hybrid magnetic layer 20 may be deteriorated by in-plane magnetic anisotropy of the Heusler alloy layer 22, and thus the hybrid magnetic layer 20 may exhibit in-plane magnetic anisotropy. Preferably, the thickness of the Heusler alloy layer 22 may be from about 0.5 nm to about 1 nm. Within this range of the thickness of the Heusler alloy layer 22, a uniaxial magnetic anisotropic constant ($K_u$) may have a maximum value, about $5 \times 10^6$ erg/cm$^3$, while vertical magnetic anisotropy is maintained.

According to some embodiments, the composition ratio of the Heusler alloy layer 22 may be adjusted, such that lattice mismatch against the FePd alloy layer 21 is less than or equal to 4%. In this case, a preferential orientation of the crystallographic axis of the FePd alloy layer 21 and a preferential orientation of the crystallographic axis of the Heusler alloy layer 22, each of which may be epitaxially grown with respect to the other, may form an angle of 45° therebetween.

According to some embodiments, as shown in FIG. 1B, a monocrystalline or polycrystalline basal thin film 15 having a Miller index (001) texture or a plan of (001) preferential orientation may be disposed between the substrate and the FePd alloy layer 21. In an embodiment, the basal thin film 15 may include MgO (001), Cr (001), Pd (001), InP (001), Ge (001), Si (001), or $Gd_2O_3$ (001). Since iron (Fe) may cause a multi-layered magnetic thin film stack to show new magnetic characteristics, the basal thin film 15 may not include iron (Fe).

Because roughness of a surface below the FePd alloy layer 21 is reduced by the basal thin film 15 which has a (001) texture, phase change of a $L1_0$ crystal structure the FePd alloy layer 21 to the may be more easily induced by the Heusler alloy layer 22 above the FePd alloy layer 21. The basal thin film 15 may have a thickness equal to or greater than 5 nm. When thickness of the basal thin film 15 is smaller than 5 nm, it is difficult to provide a basal surface having a particular texture, and the maximum thickness of the basal thin film 15 may be limited according to applications of multi-layered magnetic thin film stacks 100A and 100B.

The above-stated materials related to the basal thin film 15 having the Miller index (001) are merely examples, and embodiments of the present disclosure are not limited to these materials. For example, the basal thin film 15 may include a material having a lattice mismatch greater than 0% and equal to or smaller than 10% with respect to the FePd alloy layer 21 having the $L1_0$ crystal structure. According to another embodiment, the basal thin film 15 may be incorporated into the substrate 10. For example, the substrate 10 may be a monocrystalline or polycrystalline MgO, Cr, Pd, InP, Ge, Si, or $Gd_2O_3$ bulk substrate having a Miller index (001) texture. According to another embodiment, a composite substrate, in which a MgO (001) basal thin film 15 is formed on a MgO (001) bulk substrate 10 may be used.

According to another embodiment, as shown in FIGS. 1A and 1B, an additional layer 30 may be formed on the hybrid magnetic layer 20. The additional layer 30 may be another magnetic layer or a non-magnetic layer, including, for example, any one of rhodium (Rh), hafnium (Hf), palladium (Pd), tantalum (Ta), osmium (Os), germanium (Ge), iridium (Ir), gold (Au), and silver (Ag) or an alloy thereof. According to another embodiment, the additional layer 30 may be a tunnelling barrier layer including MgO. Alternatively, the additional layer 30 may be a protection layer or a capping layer including Ta. In an embodiment, the additional layer 30 is a layer that is suitable for using the hybrid magnetic layer 20, independently or together with another magnetic layer, as a magnetic recording element for storing information based on a magnetic resistance effect.

In various embodiments, the hybrid magnetic layer 20 may be formed via physical vapour deposition (PVD) (e.g., sputtering), chemical vapour deposition (CVD), or atomic layer deposition (ALD). In an embodiment, after the hybrid magnetic layer 20 is deposited or after the additional layer 30 is formed, a follow-up heat treatment may be performed at a temperature less than about 500° C., preferably, a low temperature of about 400° C. to induce phase change of the FePd alloy layer 21, such that the FePd alloy layer 21 has the $L1_0$ crystal structure. The follow-up heat treatment may be performed in a vacuum or a non-oxidizing atmosphere.

Figure 2A:
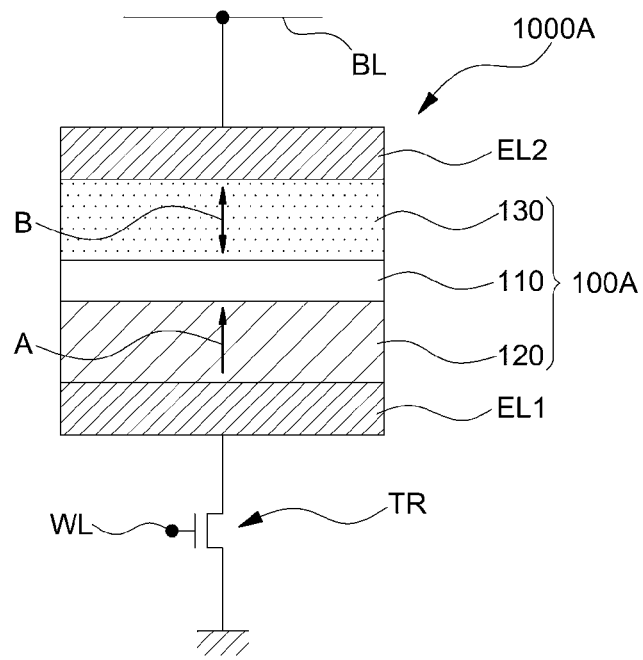
FIGS. 2A and 2B are sectional views of memory cells of non-volatile memory devices including magnetization perpendicular to the plane (MPP) type magnetic tunnelling junctions (MTJs), according to embodiments of the present disclosure.
Figure 2B:
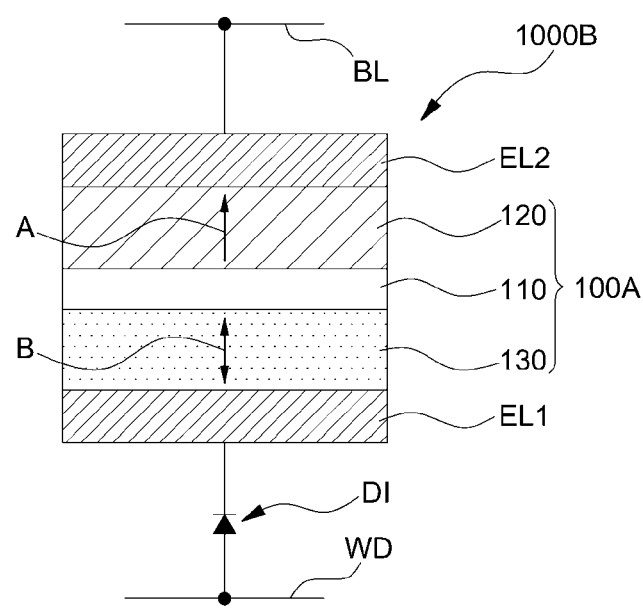

FIGS. 2A and 2B are sectional views of respective memory cells 1000A and 1000B of a non-volatile memory device including a magnetization perpendicular to the plane (MPP) type magnetic tunnelling junctions (MTJs) 100A and 100B, according to an embodiment.

Referring to FIG. 2A, the memory cell 1000A is an information storage member and may constitute a unit storage node of non-volatile magnetic memory devices. A selecting device for selecting a memory cell, e.g., a transistor TR, may be coupled to an end of the MTJ 100A of the memory cell 1000A, and thus a 1TR-1MTJ memory cell may be provided. A gate of the transistor TR may be electrically coupled with a first wire, e.g., a word line WL. The other end of the MTJ 100A may be connected to a bit line BL, for example. The memory cell 1000A may further include suitable electrodes EL1 and EL2 that are coupled with the word line WL and the bit line BL. The transistor TR is an example of a selecting device and may be a field-effect transistor or a bipolar transistor. Alternatively, the selecting device may be a switching device that uses quantum effects or nano-size effects.

Referring to FIG. 2B, according to another embodiment, a selecting device for selecting the memory cell 1000B may be a diode DI that is coupled with the memory cell 1000B in series. Therefore, a 1DI-1MTJ memory cell may be provided. In one embodiment, the diode DI shown in FIG. 2B is a PN junction diode. In another embodiment, the diode DI may be any diode that may obtain cell selectivity based on a potential difference between a word line WL and a bit line BL together with or instead of the PN junction diode DI. The diode DI may be a diode with inversed polarities, or a bilateral diode having bilateral rectifying characteristics for a unilateral driving mechanism. In another embodiment, in order to increase capacity of a memory device and/or ON-current, or to implement a multi-bit driving, the diode DI may include a Schottky barrier diode, a Zener diode, a p type semiconductor-intrinsic semiconductor-n type semiconductor (p-i-n) junction diode including an intrinsic semiconductor layer, or a p type semiconductor-intrinsic semiconductor-metal (p-i-m) junction diode.

To obtain memory cell selectivity, an Ovonic switching device may be applied, together with or instead of a transistor or diode-based switching device, as described above. According to another embodiment, due to cell selectivity of the MTJ 100A or cell selectivity of another circuit element, a selecting device may be omitted. However, embodiments of the present disclosure are not limited to these examples.

The bit lines BL and the word lines WL shown in FIGS. 2A and 2B may constitute a plurality of linear patterns extending in different directions (e.g., crossing each other perpendicularly), with a cell array in which the MTJs 100A or 100B are disposed at each cross-point at which the stripe patterns cross each other. According to an embodiment, memory cells may have a 4F2 cross-point array structure. Such a memory cell array is not limited to a 2-dimensional planar structure, and may have a 3-dimensional structure in which two or more horizontal arrays are stacked in a direction vertical to a substrate, or a 3-dimensional structure that is obtained by forming a channel layer extending in a direction vertical to a substrate.

The MTJs 100A and 100B may include a tunnelling barrier layer 110, a magnetic pinned layer 120, and a magnetic free layer 130. The order of stacking the magnetic pinned layer 120 and the magnetic free layer 130 may be reversed with respect to the tunnelling barrier layer 110, as shown in FIGS. 1A and 1B. The unilateral arrow A indicates that the magnetic pinned layer 120 has a fixed magnetization, or a fixed magnetic spin property, whereas the bilateral arrow B indicates that the magnetic free layer 130 may be magnetized in a direction parallel to or anti-parallel to the magnetization direction of the magnetic pinned layer 120.

According to an embodiment, the magnetization direction of the magnetic free layer 130 may be changed by controlling tunnelling currents that have spin talk and flow along the MTJ 100A and 100B.

The magnetic pinned layer 120 and the magnetic free layer 130 have perpendicular magnetic anisotropy (also referred to as PMA). Although not shown, a symmetrical MTJ in which another tunnelling barrier layer and another magnetic pinned layer are additionally stacked on the magnetic free layer 130 may be provided, so that two different magnetic pinned layers are oppositely disposed on the both sides of the magnetic free layer 130. Such a symmetrical MTJ may cause a programming current and an erasing current to flow unilaterally.

Figure 3A:
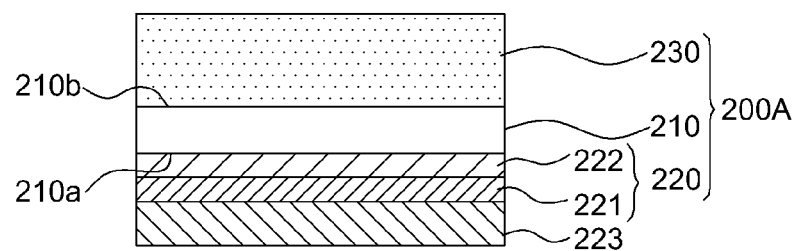
FIGS. 3A through 3C are sectional views of MTJs according to various embodiments of the present disclosure.
Figure 3B:
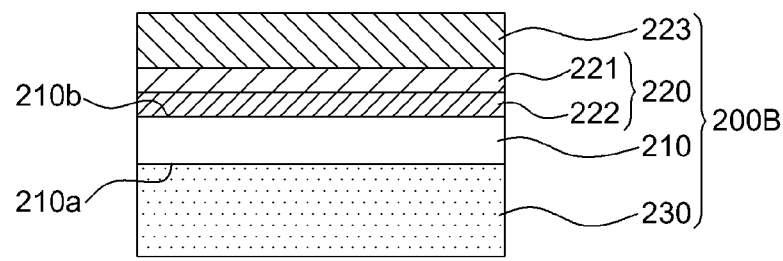

FIGS. 3A and 3B illustrate MTJs 200A and 200B according to various embodiments of the present disclosure.

Referring to FIG. 3A, the MTJ 200A includes a tunnelling barrier layer 210, a magnetic pinned layer 220 formed on a first surface 210a of the tunnelling barrier layer 210 and a magnetic free layer 230 formed on a second surface 210b of the tunnelling barrier layer 210. In various embodiments, the tunnelling barrier layer 210 may include $A_2O_3$, MgO, $TiO_2$, RuO, SrO, SiN, $CaO_x$, $HfO_2$, $Ta_2O_5$, $ZrO_2$, SiC, $SiO_2$, $SiO_xN_y$, or a stack of two or more thin films thereof. Preferably, the tunnelling barrier layer 210 may be a NaCl-type (001) preferentially-oriented MgO layer, that is, a MgO (001) layer. The MgO (001) layer may be monocrystalline or polycrystalline. In an embodiment, the order of stacking the magnetic pinned layer 220 and the magnetic free layer 230 on the respective surfaces 210a, 210b of the tunnelling barrier layer 210 may be reversed. FIG. 3B illustrates a reversed configuration of the order of stacking the magnetic pinned layer 220 and the magnetic free layer 230 on the respective surfaces 210b and 210a of the tunnelling barrier layer 210.

At least one of the magnetic pinned layer 220 and the magnetic free layer 230 may include a hybrid magnetic layer (20 of FIG. 1), which is a ferromagnetic layer according to an embodiment. In the MTJ 200A of FIG. 3A, a hybrid magnetic layer of a FePd alloy layer 221 having the above-stated $L1_0$ crystal structure and a Heusler alloy layer 222. FIG. 3A illustrates that the magnetic pinned layer 220 includes the hybrid magnetic layer including the FePd alloy layer 221 and the Heusler alloy layer 222. The Heusler alloy layer 222 directly contacts the tunnelling barrier layer 210, such that the FePd alloy layer 221 having the $L1_0$ crystal structure is stably maintained.

According to an embodiment, the magnetic pinned layer 220 or the magnetic free layer 230 may further include an additional magnetic layer 223 that is magnetically coupled with the magnetic pinned layer 220, e.g., a ferromagnetic layer. In an embodiment, the additional magnetic layer 223 may be an anti-ferromagnetic layer including any one or two or more of PtMn, IrMn, MnO, MnS, MnTe, $MnF_2$, $FeCl_2$, FeO, $CoCl_2$, CoO, $NiCl_2$, and NiO. In case of the anti-ferromagnetic layer, a suitable synthetic ferrimagnetic layer or a synthetic anti-ferromagnetic layer may be included in the magnetic pinned layer 220 or the magnetic free layer 230. In particular embodiments, the synthetic anti-ferromagnetic layer is preferable for low power consumption of spin-transfer switching and ultra large integration of a memory device employing a MTJ.

According to another embodiment, a monocrystalline or polycrystalline basal thin film (15 of FIG. 1B) having a Miller index (001) texture or a (001) preferentially-oriented surface as described above may be formed below the hybrid magnetic layer. The basal thin film may include, for example, MgO (001), Cr (001), Pd (001), InP (001), Ge (001), Si (001), or $Gd_2O_3$ (001). Preferably, the basal thin film may be a MgO (001) layer. According to another embodiment, instead of or together with the basal thin film, a MgO (001) substrate may be used.

In an embodiment of FIG. 3B, the MTJ 200B includes a tunnelling barrier layer 210, a magnetic free layer 230 on a first surface 210a of the tunnelling barrier layer 210, and a magnetic pinned layer 220 on a second surface 210b of the tunnelling barrier layer 210. The magnetic pinned layer 220 may include the hybrid magnetic layer of a FePd alloy layer 221 and a Heusler alloy layer 222, which are ferromagnetic layers according to an embodiment. In particular, the magnetic pinned layer 220 may include the hybrid magnetic layer that includes a FePd alloy layer 221 having the above-stated $L1_0$ crystal structure and a Heusler alloy layer 222. The Heusler alloy layer 222 also directly contacts the tunnelling barrier layer 210, functions as a buffer layer between the tunnelling barrier layer 210 and the FePd alloy layer 222 to stably maintain a $L1_0$ crystal structure in the FePd alloy layer 221, and improves spin-polarizability at the interface between the tunnelling barrier layer 210 and the hybrid magnetic layers, which is the magnetic pinned layer 220 in FIG. 3B.

The tunnelling barrier layer 210 of FIG. 3B may be configured according to the description given above with reference to FIG. 3A. Furthermore, as denoted by the reference numeral 223 in FIG. 3B, another additional magnetic layer 223 that may be magnetically coupled with the magnetic pinned layer 220 may be provided. The additional magnetic layer 223 may be a ferromagnetic layer or an anti-ferromagnetic layer. A protection layer or a capping layer (not shown), which may be a metal layer including Ta or Pt, may be disposed on the additional magnetic layer 223. In other example, the protection layer or the capping layer may be formed directly on the magnetic pinned layer 220.

Although FIGS. 3A and 3B show that a hybrid magnetic layer according to an embodiment may be applied as a part of the magnetic pinned layer 220 or as the entire magnetic pinned layer 220. However, embodiments of the present disclosure are not limited thereto. For example, in FIGS. 3A and 3B, the hybrid magnetic layer may be applied selectively to the magnetic free layer 230, or to both the magnetic pinned layer 220 and the magnetic free layer 230. Furthermore, an embodiment may include a magnetic free layer including a synthetic ferrimagnetic layer based on anti-parallel interlayer exchange coupling (AP-IEC).

Figure 3C:
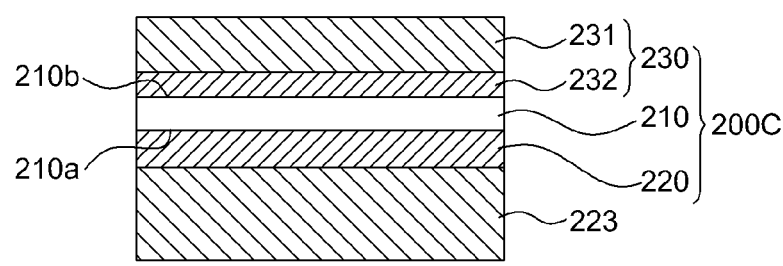

FIG. 3C illustrates an embodiment in which the magnetic free layer 230 includes a hybrid magnetic layer including a FePd alloy layer 231 having the above-stated $L1_0$ crystal structure and a Heusler alloy layer 232. The Heusler alloy layer 232 is disposed between the tunnelling barrier layer 210 and the FePd alloy layer 231 having the $L1_0$ crystal structure, such that the FePd alloy layer 231 having the $L1_0$ crystal structure is stably maintained. Furthermore, although not shown, a symmetrical MTJ in which another tunnelling barrier layer and another magnetic pinned layer may be additionally stacked on the magnetic free layer 230, so that magnetic pinned layers are disposed on both surfaces of the magnetic free layer 230 to face each other.

In the various MTJs 200A, 200B, and 200C described above with reference to FIGS. 3A through 3C, thickness of the FePd alloy layer 221 of the hybrid magnetic layer may be from about 3 nm to about 10 nm, and thickness of the Heusler alloy layer 222 may be from about 0.2 nm to about 5 nm. In an embodiment, the specific thickness of the Heusler alloy layer 222 may be determined in conjunction with, or based on, thickness of the FePd alloy layer 221. In an embodiment, perpendicular magnetic anisotropy (PMA) may be exhibited.

The magnetic pinned layer 220 including the above-disclosed hybrid magnetic layer and the magnetic free layer 230 exhibit the perpendicular magnetic anisotropy (PMA).

Hereinafter, magnetic and crystallographic characteristics and performances of hybrid magnetic layers according to embodiments will be described.

Experimental Embodiments

Figure 4:
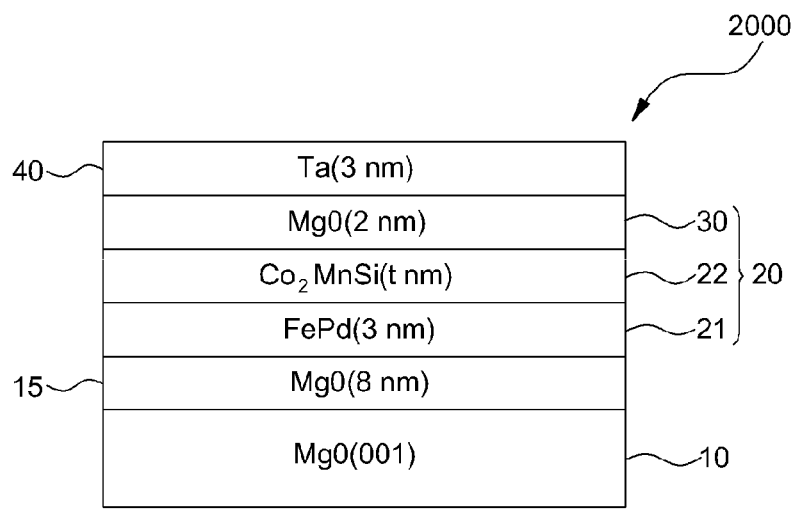
FIG. 4 is a sectional view of a multi-layered magnetic thin film stack including a hybrid magnetic layer according to an embodiment of the present disclosure.

In order to determine magnetic and crystallographic characteristics of the hybrid magnetic layer 20 including a FePd magnetic layer and a Heusler alloy layer according to an embodiment of the present disclosure, a magnetic thin film stack 2000 including a FePd alloy layer 21 and a Heusler alloy layer 22 on the substrate 10 as shown in FIG. 4 was formed. The substrate 10 was a MgO (001) bulk substrate, and the basal thin film 15 was formed to reduce surface roughness of the substrate 10. The basal thin film 15 was a MgO thin film having a thickness equal to or greater than 5 nm (in this case, about 8 nm), and was formed via sputtering by using a MgO target in Ar atmosphere under ultra-high vacuum corresponding to a base pressure below or equal to $3\times10^{-9}$ Torr. However, the sputtering is merely an example, and the present disclosure is not limited thereto. For example, in other embodiments the hybrid magnetic layer 20 may formed via physical vapour deposition (PVD) (e.g., electron beam evaporation), chemical vapour deposition (CVD) or atomic layer deposition (ALD) using a suitable precursor.

The hybrid magnetic layer 20 was formed on the MgO basal thin film 15. The FePd alloy layer 21 included an alloy of Fe and Pd at 1:1 composition ratio and was formed via ultra high-vacuum sputtering. The FePd alloy layer 21 had a thickness selected within a range from about 3 nm to about 10 nm, in this case, about 3 nm. The Heusler alloy layer 22 may include Co, Mn, and Si at a ratio for forming $Co_2MnSi$ based on a phase diagram.

A plurality of magnetic thin film stack samples in which the Heusler alloy layer 22 has a thickness selected from more than 0 nm to about 1.5 nm were fabricated. In FIG. 4, the thickness value is designated as "t." A MgO layer 30 having thickness of about 2 nm, which is a tunnelling barrier layer, was formed on the hybrid magnetic layer 20. A Ta layer 40 was formed on the MgO layer 30 as a protection layer. A thickness of the Ta layer 40 was about 3 nm. After all of the above-stated layers were formed, while a magnetic field was being applied thereto, the magnetic thin film stacks were heat treated at a temperature of about 400° C. Since heat treatment is generally performed as a high-temperature operation in an end process, such as a wiring operation for fabricating a memory, the heat treatment was performed on the magnetic thin film stacks 2000 for about an hour in a vacuum atmosphere below or equal to $1\times10^{-6}$ Torr immediately after the magnetic thin film stacks 2000 were deposited.

FIGS. 5A through 5D are graphs showing magnetic characteristics of the magnetic thin film stacks 2000 of FIG. 4. The magnetic moment-applied magnetic field (m-H) loop was obtained by evaluating magnetic characteristics of respective magnetic thin film stacks under an out-of-plane (H⊥) magnetic field and an in-plane (H∥) magnetic field by using a vibrating sample magnetometer (VSM) at room temperature.

Figure 5A:
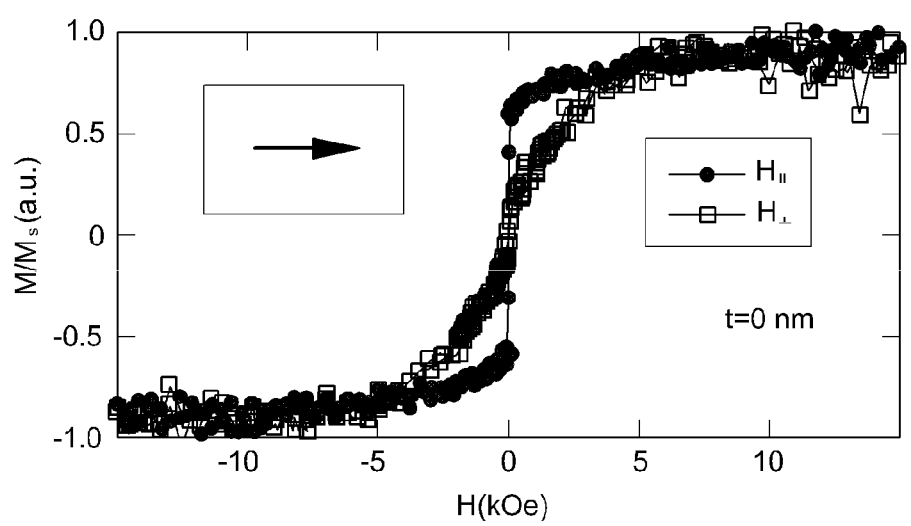
FIGS. 5A through 5D are graphs showing magnetic characteristics of the magnetic thin film stacks of FIG. 4.
Figure 5B:
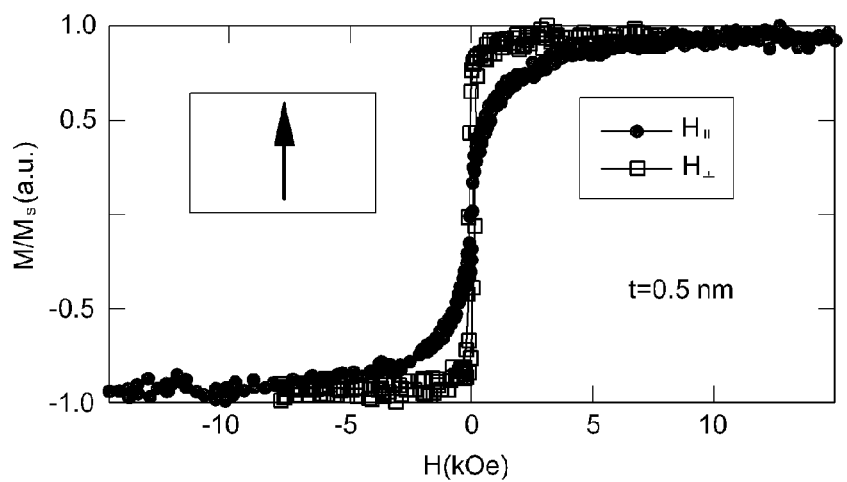
Figure 5C:
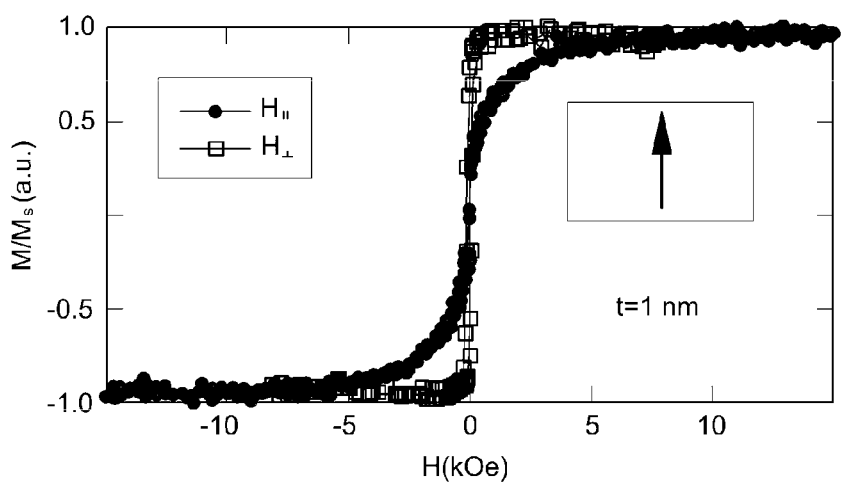

Referring to FIG. 5A, when the Heusler alloy layer 22 does not exist (that is, thickness t=0), the corresponding magnetic thin film stack only exhibits an in-plane magnetic anisotropy. The phenomenon is consistent to a result shown in FIG. 6 in which only a face-centered cubic FePd (200) peak and a FePd (002) peak appear at the FePd alloy layer 21. However, referring to FIGS. 5B and 5C, in a magnetic thin film stack including the Heusler alloy layer 22 having a thickness t from about 0.5 nm to about 1 nm (which is within a range from about 0.2 nm to about 1.5 nm), perpendicular magnetic anisotropy appears. This indicates that the FePd alloy layer 21 is stably phase-changed to have the $L1_0$ crystal structure due to the Heusler alloy layer 22. Furthermore, it also shows that the Heusler alloy layer 22 lowers phase-change temperature of the FePd alloy layer 21 to about 400° C., and the FePd alloy layer 21 that has the $L1_0$ crystal structure grown in the direction (001) also helps the $Co_2MnSi$ alloy layer 22 to grow to the B2 crystal phase or $L2_1$ crystal phase. In this case, the uniaxial magnetic anisotropy constant (Ku) amounts to about $5\times10^6$ erg/cm³.

Figure 5D:
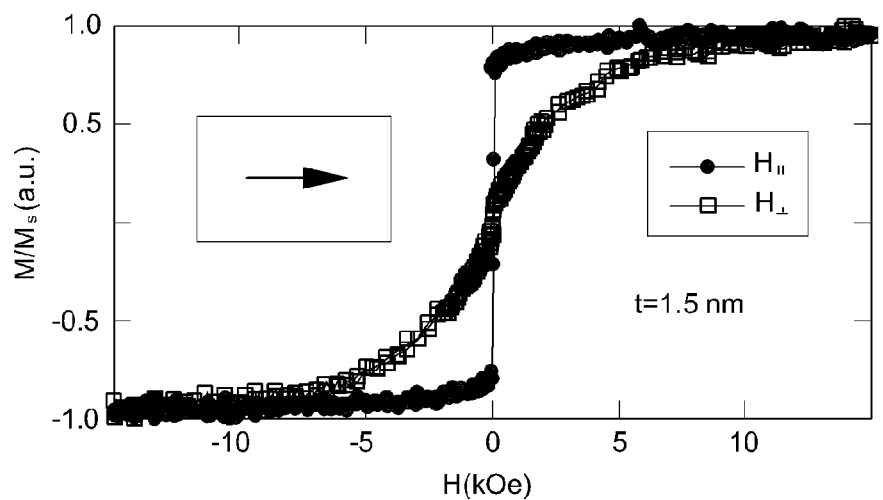

However, referring to FIG. 5D, when the thickness of the Heusler alloy layer 22 increases to about 1.5 nm, even when a magnetic field H decreases from a saturation value, a magnetic moment M/Ms continuously decreases from a saturation magnetic moment, and thus in-plane magnetic anisotropy appears again. The reason thereof is that, since the in-plane magnetic anisotropy of the Heusler alloy layer 22 is stronger than the perpendicular magnetic anisotropy of the FePd alloy layer 21 having the $L1_0$ crystal structure, the overall hybrid magnetic layer 20 exhibits in-plane magnetic anisotropy. This result is consistent with the description given above with reference to Equation 1.

Figure 6:
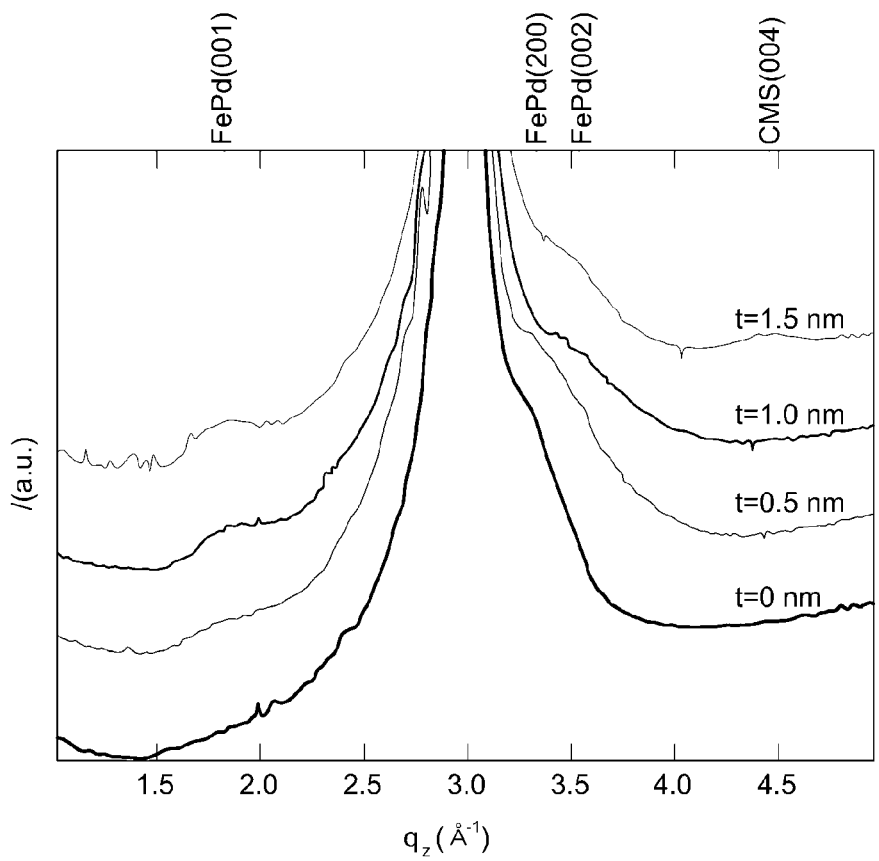
FIG. 6 is a graph showing a result of an out-of-plane X-ray diffraction analysis on a hybrid magnetic layer including a FePd alloy layer and a Heusler alloy layer according to an embodiment of the present disclosure.

FIG. 6 is a graph showing a result of an out-of-plane X-ray diffraction analysis on a hybrid magnetic layer including a FePd alloy layer and a Heusler alloy layer according to an embodiment.

Referring to FIG. 6, when no Heusler alloy layer 22 is present (that is, thickness t=0), only a face-centered cubic FePd (200) peak and a FePd (002) peak appear in the FePd alloy layer 21. However, in a magnetic thin film stacks including the Heusler alloy layer 22 having a thickness t of about 0.5 nm and about 1 nm (which are within a range from about 0.2 nm to about 1.5 nm), a FePd (001) peak related to the $L1_0$ crystal structure appears. Similarly, in a magnetic thin film stack including the Heusler alloy layer 22 having a thickness t of about 1.5 nm, a FePd (001) peak related to the $L1_0$ crystal structure appears.

However, as described above, since the Heusler alloy layer 22 exhibits in-plane magnetic anisotropy, the in-plane magnetic anisotropy due to the Heusler alloy layer 22 having an increased thickness becomes stronger, so the overall hybrid magnetic layer 20 exhibits the in-plane magnetic anisotropy. A $Co_2MnSi$ (004) peak appeared in the Heusler alloy layer 22.

Figure 7:
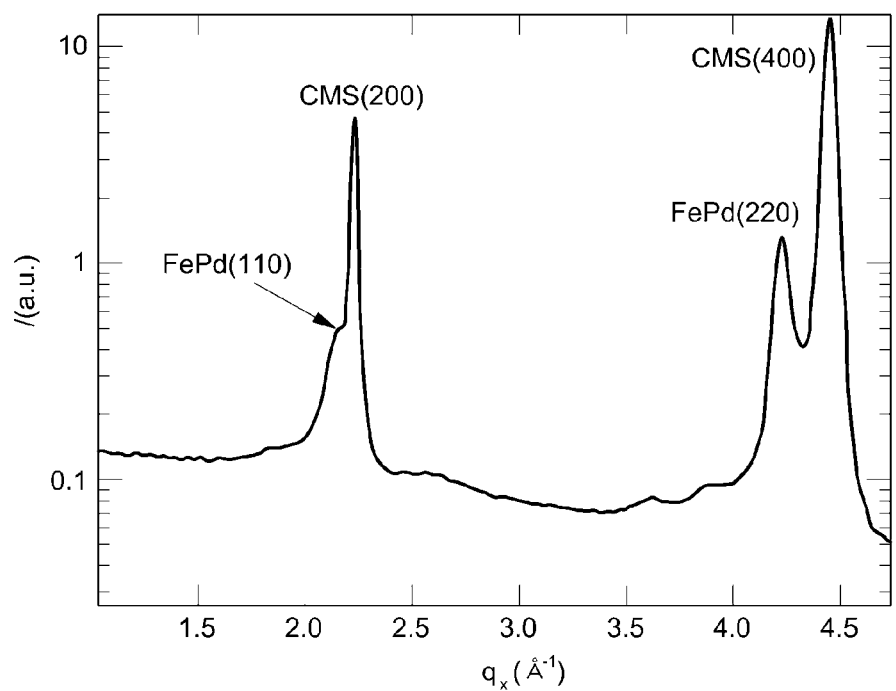
FIG. 7 is a graph showing a result of an in-plane X-ray diffraction analysis on a hybrid magnetic layer according to an embodiment.
Figure 8A:
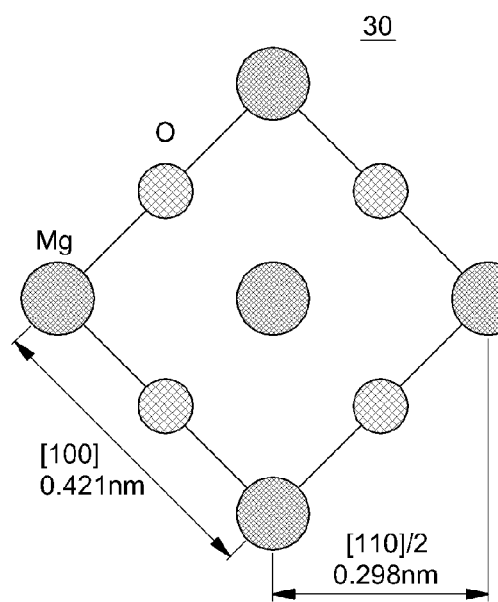
FIGS. 8A through 8D are schematic diagrams of crystal structures for describing a film-forming mechanism of the hybrid magnetic layer.
Figure 8B:
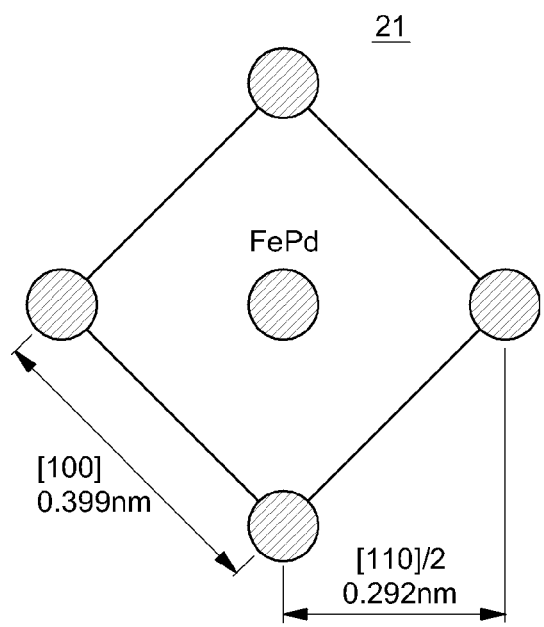
Figure 8C:
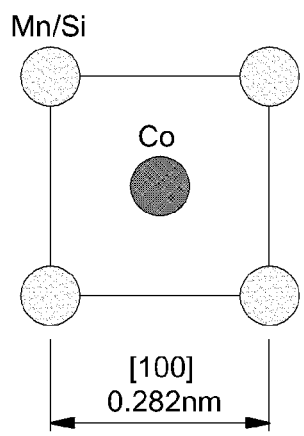
Figure 8D:
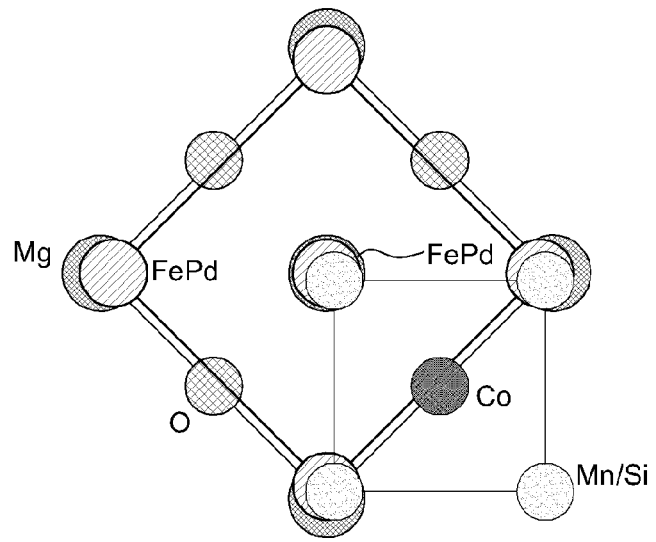

FIG. 7 is a graph showing a result of an in-plane X-ray diffraction analysis of a hybrid magnetic layer according to an embodiment, and FIGS. 8A through 8D are schematic diagrams of crystal structures for describing a film-forming mechanism of the hybrid magnetic layer. Thickness of a Heusler alloy layer in the hybrid magnetic layer is about 20 nm.

Referring to FIG. 7, the X-ray diffraction analysis was performed by fixing a scattering vector of a magnetic layer in the MgO [110] direction. At the FePd alloy layer 21, only FePd (110) and FePd (220) peaks appeared. At the Heusler alloy layer 22, only $Co_2MnSi$ (200) and $Co_2MnSi$ (400) peaks appeared. This indicates that epitaxial growth occurred while the preferentially-oriented crystallographic axis of the FePd alloy layer 21 and the preferentially-oriented crystallographic axis of the Heusler alloy layer 22 are oriented to form an angle of 45° therebetween.

Referring to FIGS. 8A through 8D, in a multi-layered magnetic thin film stack (FIG. 8D) including a MgO (001) layer (30 of FIG. 8A) as a tunnelling barrier layer, a FePd (001) alloy layer (21 of FIG. 8B), and a $Co_2MnSi$ (001) layer (22 of FIG. 8C) as a Heusler alloy layer between the MgO (001) layer 30 and the FePd (001) alloy layer 21. Similarities between lattice constants and crystallographic structures of the first interface between the MgO (001) layer 30 and the $Co_2MnSi$ (001) layer and the second interface between the $Co_2MnSi$ (001) layer and the FePd (001) layer may be taken into account. Since the $CO_2MnSi$ (001) layer 22 as a Heusler alloy layer has a lattice mismatch of only about 5.0% against the MgO (001) layer 30, and has a lattice mismatch of about 3.9% against the FePd (001) alloy layer 21, the $Co_2MnSi$ (001) layer 22 interposed between the two thin films 21 and 30 may function as a buffer layer that reduces lattice mismatch of about 9.3% between the FePd alloy layer and the MgO layer and induces epitaxial growth of the FePd alloy layer having the $L1_0$ crystal structure and the MgO layer.

According to an embodiment, when the FePd alloy layer 21 grows in (001) direction, the FePd alloy layer 21 has a $L1_0$ phase, thereby securing a high level of perpendicular magnetic anisotropy. When the $Co_2MnSi$ layer 22 grows in the (001) direction, the $Co_2MnSi$ layer has a B2 crystal phase or a $L2_1$ crystal phase, and thus high spin polarizability may be expected. Since lattice mismatch between the FePd alloy layer 21 and the $Co_2MnSi$ layer 22 is only about 3.9%, mutual epitaxial growth of the FePd alloy layer 21 and the $Co_2MnSi$ layer 22 may occur.

In the embodiment described above, the $Co_2MnSi$ alloy layer is merely an example, and embodiments of the present disclosure are not limited thereto. Since lattice constant of a Heusler alloy layer may be controlled according to solid-solution ratio of the Heusler alloy layer, the Heusler alloy layer 22 may include a cobalt (Co) based alloy having a chemical formula $Co_2YZ$ (Y is a transition metal and Z is a typical element). The transition metal Y may be at least one of manganese (Mn), iron (Fe), and chromium (Cr), for example. However, embodiments of the present disclosure are not limited thereto. The typical element Z may be at least one of silicon (Si), aluminium (Al), and germanium (Ge), for example. However, embodiments of the present disclosure are not limited thereto. The Heusler alloy layer 22 may exhibit high perpendicular polarizability when the Heusler alloy layer 22 has a B2 crystal phase or a $L2_1$ crystal phase. For example, the Heusler alloy layer 22 may include $Co_2MnSi$, as described above.

Figure 9:
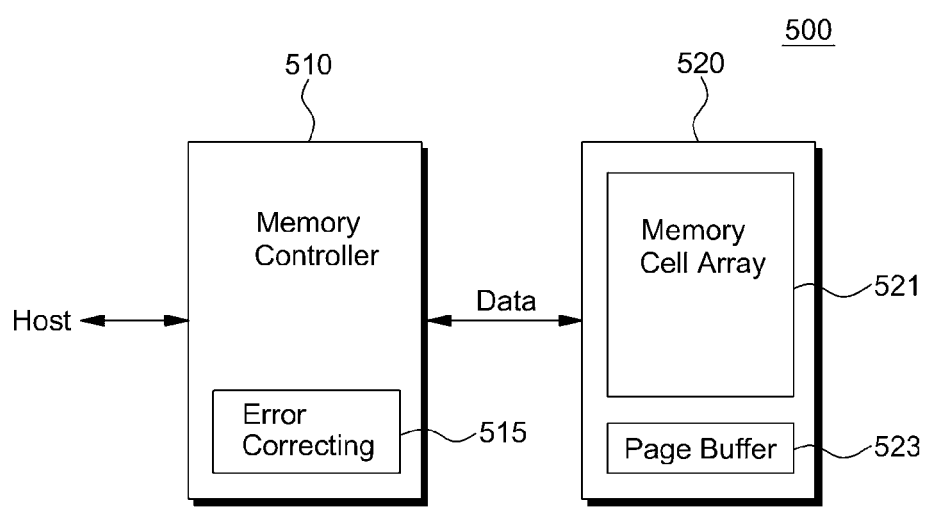
FIG. 9 is a block diagram showing a memory system according to an embodiment of the present disclosure.

FIG. 9 is a block diagram showing a memory system 500 according to an embodiment.

Referring to FIG. 9, the memory system 500 may include a memory controller 510 and a non-volatile memory device 520. The memory controller 510 may perform error correcting codes on the non-volatile memory device 520. The memory controller 510 may control the non-volatile memory device 520 based on commands and addresses received from the outside circuit.

When a write request is received from a host, the memory controller 510 may perform an error correcting encoding on information requested to be written. Furthermore, the memory controller 510 may control the non-volatile memory device 520 to program the encoded information at a memory region corresponding to a provided address. Furthermore, during a read operation, the memory controller 510 may perform an error correcting decoding on information output by the non-volatile memory device 520. Errors included in output data may be corrected by the error correcting decoding. To detect and correct errors, the memory controller 510 may include an error correcting block 515.

The non-volatile memory device 520 may include a memory cell array 521 and a page buffer 523. The memory cell array 521 is an array of memory cells including the multi-layered magnetic thin film stacks or magnetic tunnelling junctions as described above and may include an array of single-level memory cells or 2 or higher bit multi-level memory cells. When an initialization request is received, the memory controller 510 may initialize the memory cells to have a determined state by using a programming technique or an erasing technique using voltage signals.

Figure 10:
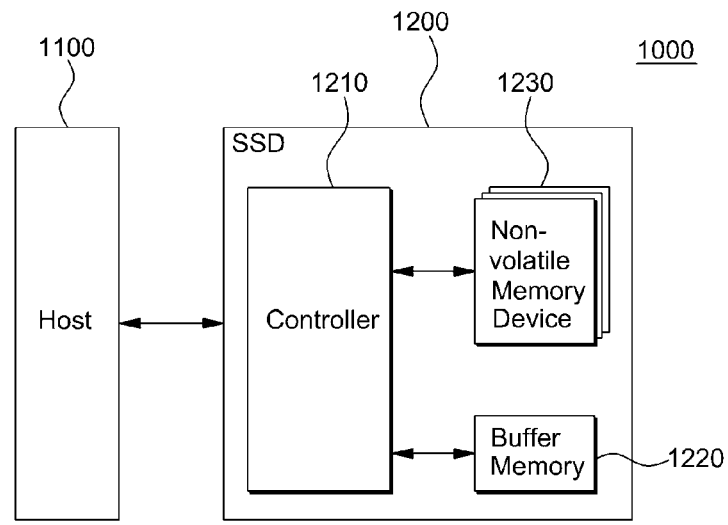
FIG. 10 is a block diagram showing a data storage device including a SSD according to an embodiment of the present disclosure.

FIG. 10 is a block diagram showing a data storage device 1000 including a SSD according to an embodiment.

Referring to FIG. 10, the data storage device 1000 includes a host 1100 and a SSD 1200. The SSD 1200 may include a SSD controller 1210, a buffer memory 1220, and a non-volatile memory device 1230. The SSD controller 1210 provides electric and physical connections between the host 1100 and the SSD 1200. According to an embodiment, the SSD controller 1210 may provide an interface between the host 1100 and the SSD 1200 in correspondence to a bus format of the host 1100. Furthermore, the SSD controller 1210 may decode commands provided by the host 1100 and access the non-volatile memory device 1230 based on a result of the decoding of the commands. As non-limiting examples of the bus format of the host 1100, a USB (Universal Serial Bus), a SCSI (Small Computer System Interface), a PCI express, an ATA (Advanced Technology Attachment), a PATA (Parallel ATA), a SATA (Serial ATA), and a SAS (Serial Attached SCSI) may be utilized.

Data to be written provided by the host 1100 or data read out from the non-volatile memory device 1230 may be temporarily stored in the buffer memory 1220. When the host 1100 sends a read request and data existing in the non-volatile memory device 1230 is cached, the buffer memory 1220 may provide a cache function for providing cached data directly to the host 1100. Generally, data transmission rate based on a bus format (e.g., SATA or SAS) of the host 1100 may be faster than data transmission speed of memory channels of the SSD 1200. In this case, the large-capacity buffer memory 1220 may be provided to minimize performance deterioration based on a speed difference. The buffer memory 1220 may be a synchronous DRAM for providing sufficient buffering. However, the inventive concept is not limited thereto.

The non-volatile memory device 1230 may be provided as a storage medium for the SSD 1200. For example, the non-volatile memory device 1230 may be a STT-MRAM with large storage capacity. For another example, a NOR-type flash memory, a phase-change memory, another magnetic memory, a resistive memory, a ferro-dielectric memory, or a hybrid memory comprising a combination thereof may be applied as the non-volatile memory device 1230.

Figure 11:
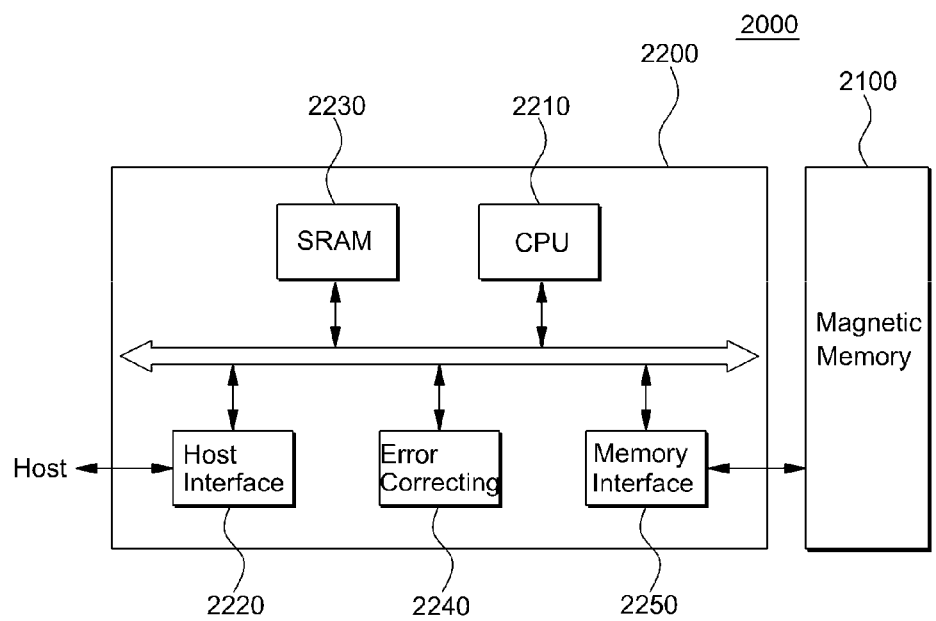
FIG. 11 is a block diagram showing a memory system according to another embodiment of the present disclosure.

FIG. 11 is a block diagram showing a memory system 2000 according to another embodiment.

Referring to FIG. 11, the memory system 2000 may include a memory controller 2200 and a magnetic memory device 2100. The magnetic memory device 2100 may include the non-volatile memory devices as described above with reference to FIGS. 1 through 10.

The memory controller 2200 may be configured to control the magnetic memory device 2100. A SRAM 2230 may be used as a memory for operation of the CPU 2210. A host interface 2220 may embody a data exchange protocol for a host to be connected to the memory system 2000. An error correcting circuit 2240 arranged at the memory controller 2200 may detect and correct errors contained in data read out from the magnetic memory device 2100. A memory interface 2250 may interface with the magnetic memory device 2100. The CPU 2210 may perform overall control operations for data exchange of the memory controller 2200.

The memory system 2000 according to the inventive concept may further include a ROM (not shown) that stores code data for interfacing with a host.

The magnetic memory device 2100 may be configured to communicate with an external circuit (e.g., a host) via one of various interface protocols, such as USB, MMC, PCI-E, SAS, SATA, PATA, SCSI, ESDI, or IDE. The memory system 2000 according to the inventive concept may be applied to various user devices, such as a ultra mobile PC (UMPC), a workstation, a net-book, a personal digital assistant (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device capable of transmitting and receiving data wirelessly, or a home network.

Figure 12:
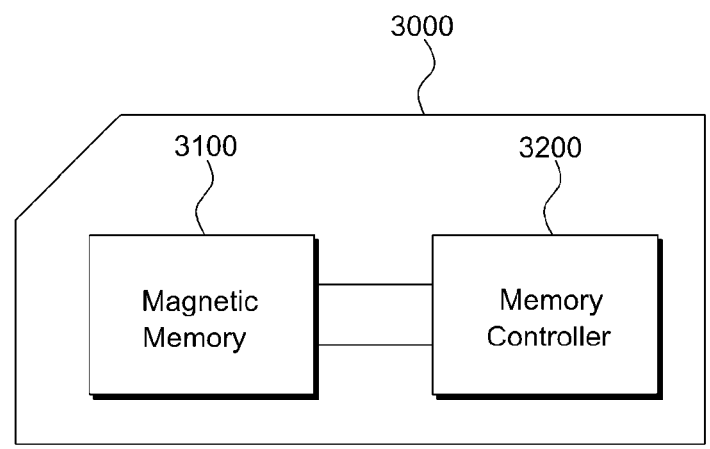
FIG. 12 is a block diagram showing a data storage device according to another embodiment of the present disclosure.

FIG. 12 is a block diagram showing a data storage device 3000 according to another embodiment.

Referring to FIG. 12, the data storage device 3000 may include a magnetic memory 3100 and a magnetic controller 3200. The magnetic controller 3200 may control the magnetic memory 3100 based on control signals received from an external circuit connected to the data storage device 3000. A 3-dimensional memory array structure of the magnetic memory 3100 may be a cross-point structure-based horizontally or vertically stacked structure, and the inventive concept is not limited thereto.

The data storage device 3000 according to the inventive concept may constitute a memory card device, a SSD device, a multimedia card device, a SD card, a memory stick device, a hard disk drive device, a hybrid drive device, or a USB flash device. For example, the data storage device 3000 according to the inventive concept may be a memory card that satisfies a standard or a specification to be used by an electronic device, such as a digital camera or a personal computer.

Figure 13:
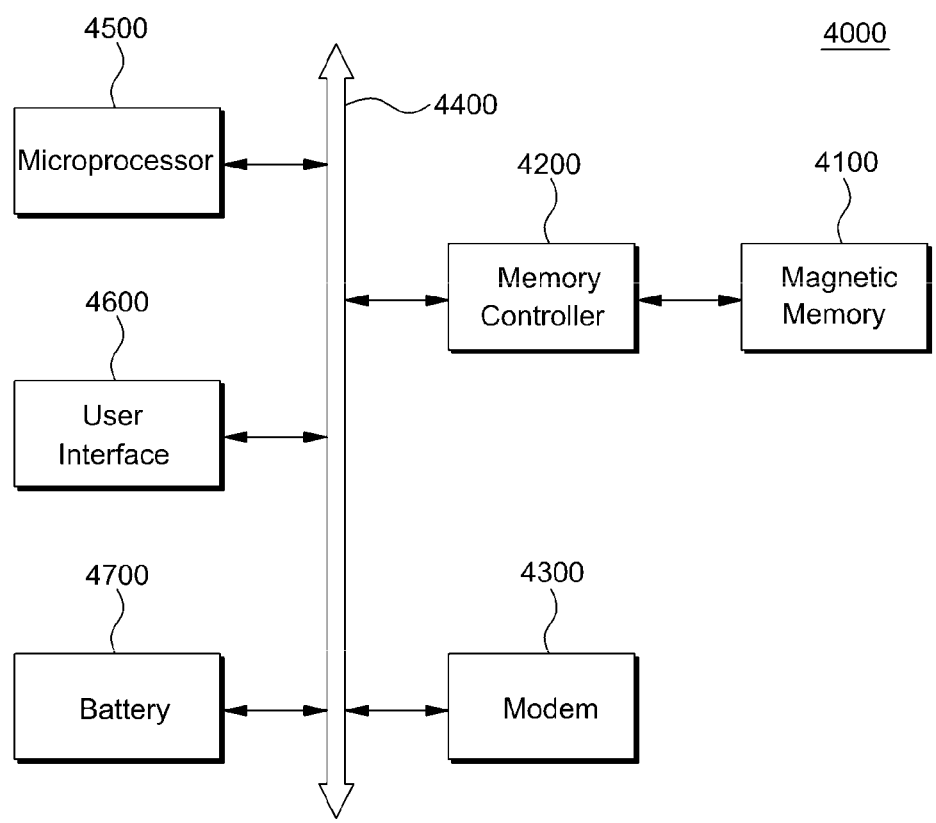
FIG. 13 is a block diagram showing a magnetic memory device and a computing system including the same according to an embodiment of the present disclosure.

FIG. 13 is a block diagram showing a magnetic memory device 4100 according to an embodiment and a computing system 4000 including the same.

Referring to FIG. 13, the computing system 4000 according to the inventive concept may include the magnetic memory device 4100, a memory controller 4200, a modem 4300, such as a baseband chipset, a microprocessor 4500, and a user interface 4600 that are electrically connected to a bus 4400.

The magnetic memory device 4100 shown in FIG. 13 may be a non-volatile memory device as described above. The computing system 4000 according to the inventive concept may be a mobile device. In this case, the computing system 4000 may further include a battery 4700 for supplying a voltage for operating the computing system 4000. Although not shown, the computing system 4000 according to the inventive concept may further include an application chipset, a camera image processor (CIS), or a mobile DRAM. The memory controller 4200 and the magnetic memory device 4100 may constitute a SSD using a non non-volatile memory device for storing data.

A non-volatile memory device and/or a memory controller according to the inventive concept may be mounted via various types of packages. For example, a non-volatile memory device and/or a memory controller may be mounted via any of various packages including PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), or Wafer-Level Processed Stack Package (WSP).

According to an embodiment of the present disclosure, there may be provided a multi-layered magnetic thin film stack in which, as a Heusler alloy layer is interposed between a FePd alloy layer and a tunneling barrier layer, the crystal structure of the FePd alloy layer may be induced to stably have an $L1_0$ crystal structure at a low temperature, spin polarizability of the FePd alloy layer may be enhanced, and high tunneling magnetic resistance may be secured at a perpendicular tunnel magnetic junction due to high perpendicular magnetic anisotropy.

According to another embodiment of the present disclosure, there may be provided a data storage device including a multi-layered magnetic thin film stack having the above-stated advantages.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims.

What is claimed is:

1. A multi-layered magnetic thin film stack comprising:
   a FePd alloy layer comprising an alloy of iron (Fe) and palladium (Pd);
   a tunneling barrier layer disposed on the FePd alloy layer, the tunneling barrier layer comprising MgO; and
   a Heusler alloy layer disposed between the FePd alloy layer and the tunneling barrier layer,
   wherein an angle difference between a preferential oriented crystallographic axis of the FePd alloy layer and a preferential-oriented crystallographic axis of the Heusler alloy layer comprises 45°.

2. The multi-layered magnetic thin film stack of claim 1, wherein the Heusler alloy layer comprises a cobalt (Co) based alloy having a chemical formula $Co_2YZ$, in which Y denotes a transition metal, and Z denotes a typical element.

3. The multi-layered magnetic thin film stack of claim 2, wherein the transition metal Y comprises at least one of manganese (Mn), iron (Fe), and chromium (Cr), and the typical element Z comprises at least one of silicon (Si), aluminium (Al), and germanium (Ge).

4. The multi-layered magnetic thin film stack of claim 1, wherein the Heusler alloy layer comprises $Co_2MnSi$.

5. The multi-layered magnetic thin film stack of claim 1, wherein lattice mismatch between the Heusler alloy layer and the FePd alloy layer is less than or equal to 4%.

6. The multi-layered magnetic thin film stack of claim 1, wherein the FePd alloy layer has an $L1_0$ crystal structure.

7. The multi-layered magnetic thin film stack of claim 1, wherein the Heusler alloy layer has a B2 crystal structure or an $L2_1$ crystal structure.

8. A magnetic tunneling junction (MTJ) comprising a tunneling barrier layer, a magnetic pinned layer disposed on a first surface of the tunneling barrier layer, and a magnetic free layer disposed on a second surface of the tunneling barrier layer that is opposite to the first surface of the tunneling barrier layer,
   wherein at least one of the magnetic pinned layer and the magnetic free layer comprises a hybrid magnetic layer that comprises:
   a FePd alloy layer comprising iron (Fe) and palladium (Pd), and having an $L1_0$ crystal structure and a perpendicular easy magnetization axis; and a Heusler alloy layer disposed between the FePd alloy layer and the tunneling barrier layer,
wherein an angle difference between a preferential oriented crystallographic axis of the FePd alloy layer and a preferential-oriented crystallographic axis of the Heusler alloy layer comprises 45°.

9. The MTJ of claim 8, wherein the magnetic pinned layer or the magnetic free layer comprises an anti-ferromagnetic layer magnetically coupled with the hybrid magnetic layer.

10. The MTJ of claim 8, wherein the Heusler alloy layer comprises a cobalt (Co) based alloy having a chemical formula $Co_2YZ$, in which Y denotes a transition metal, and Z denotes a typical element.

11. The MTJ of claim 10, wherein the transition metal Y comprises at least one of manganese (Mn), iron (Fe), and chromium (Cr), and the typical element Z comprises at least one of silicon (Si), aluminium (Al), and germanium (Ge).

12. The MTJ of claim 8, wherein the Heusler alloy layer comprises $Co_2MnSi$.

13. The MTJ of claim 8, wherein lattice mismatch between the Heusler alloy layer and the FePd alloy layer is less than or equal to 4%.

14. The MTJ of claim 8, wherein the Heusler alloy layer has an $L1_0$ crystal structure.

15. The MTJ of claim 8, wherein the Heusler alloy layer has a B2 crystal structure or an $L2_1$ crystal structure.

16. The MTJ of claim 8, further comprising a substrate on a first surface of the FePd alloy layer, the first surface opposite to a second surface of the FePd alloy layer, the second surface contacting the Heusler alloy layer.

17. The MTJ of claim 16, wherein the substrate comprises a monocrystalline or polycrystalline material having a Miller index (001) texture or a (001) preferentially-oriented surface.

18. The MTJ of claim 16, wherein the substrate comprises a MgO (001) basal thin film.

* * * * *